(12) United States Patent
Wang et al.

(10) Patent No.: US 12,742,257 B2
(45) Date of Patent: Sep. 22, 2026

(54) VERTICAL PHOTO-ASSISTED METAL ORGANIC CHEMICAL VAPOR DEPOSITION (MOCVD) APPARATUS AND DEPOSITION METHOD USING SAME

(71) Applicant: PEKING UNIVERSITY, Beijing (CN)

(72) Inventors: Xinqiang Wang, Beijing (CN); Zhaoying Chen, Beijing (CN); Fang Liu, Beijing (CN); Bowen Sheng, Beijing (CN); Duo Li, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 0 days.

(21) Appl. No.: 19/115,964

(22) PCT Filed: Aug. 17, 2023

(86) PCT No.: PCT/CN2023/113505

§ 371 (c)(1),
(2) Date: Mar. 27, 2025

(87) PCT Pub. No.: WO2024/169148

PCT Pub. Date: Aug. 22, 2024

(65) Prior Publication Data

US 2026/0002285 A1 Jan. 1, 2026

(30) Foreign Application Priority Data

Feb. 14, 2023 (CN) ........................ 202310140721.1

(51) Int. Cl.
*C30B 25/14* (2006.01)
*C30B 25/12* (2006.01)
*C30B 29/54* (2006.01)

(52) U.S. Cl.
CPC ............. *C30B 25/12* (2013.01); *C30B 25/14* (2013.01); *C30B 29/54* (2013.01)

(58) Field of Classification Search
CPC ......... C30B 25/00; C30B 25/02; C30B 25/10; C30B 25/12; C30B 25/14; C30B 25/16;
(Continued)

(56) References Cited

U.S. PATENT DOCUMENTS

H1264 H * 12/1993 Epler ........................... 117/103
2013/0260488 A1* 10/2013 Kim .................. C23C 16/45502 118/728
2022/0290301 A1 9/2022 Zhao et al.

FOREIGN PATENT DOCUMENTS

CN 101403108 A 4/2009
CN 102021530 A 4/2011
(Continued)

OTHER PUBLICATIONS

International Search Report and Written Opinion with English translation, PCT/CN2023/113505, Nov. 24, 2023, 12 pages.

*Primary Examiner* — Kenneth A Bratland, Jr.
(74) *Attorney, Agent, or Firm* — JEEN IP LAW, LLC

(57) ABSTRACT

A vertical photo-assisted metal organic chemical vapor deposition (MOCVD) apparatus and a deposition method using the same are provided. In the vertical photo-assisted MOCVD apparatus, a light field vertically acts on the layered reactant gas flows, and interaction paths between the light field and the reactant gas flows are short, which reduces the required light source power, lowers the design complexity of the photo-assisted MOCVD apparatus, improves the safety of the photo-assisted MOCVD apparatus and the utilization efficiency of the light field power. In the vertical photo-assisted MOCVD apparatus, through self-rotation and revolution of the growth substrates with the substrate susceptor, active reactants generated by the light field are uniformly distributed between the growth substrates and
(Continued)

within each growth substrate in the growth chamber, thereby achieving high uniformity large-size photo-assisted MOCVD epitaxial growth.

6 Claims, 2 Drawing Sheets

(58) Field of Classification Search
CPC ....... C30B 25/165; C30B 29/00; C30B 29/54; C30B 35/00
USPC ...... 117/84, 88, 98, 102–104, 108, 200–204, 117/925
See application file for complete search history.

(56) References Cited

FOREIGN PATENT DOCUMENTS

| | | | |
|---|---|---|---|
| CN | 102899638 | A | 1/2013 |
| CN | 103243311 | A | 8/2013 |
| CN | 103603038 | A | 2/2014 |
| CN | 104532211 | A | 4/2015 |
| CN | 115679443 | A | 2/2023 |
| CN | 116121862 | A | 5/2023 |

* cited by examiner

VERTICAL PHOTO-ASSISTED METAL ORGANIC CHEMICAL VAPOR DEPOSITION (MOCVD) APPARATUS AND DEPOSITION METHOD USING SAME

CROSS REFERENCE TO RELATED APPLICATION

This patent application is a national stage application of International Patent Application No. PCT/CN2023/113505, filed on Aug. 17, 2023, which claims the benefit and priority of Chinese Patent Application No. 202310140721.1 filed on Feb. 14, 2023, the disclosures of which are incorporated by reference herein in their entireties.

TECHNICAL FIELD

The present disclosure relates to vapor phase epitaxy technology for semiconductor materials, and specifically relates to a vertical photo-assisted metal organic chemical vapor deposition (MOCVD) apparatus and a deposition method using the same.

BACKGROUND

Metal organic chemical vapor deposition (MOCVD) is suitable for epitaxial growth of semiconductor heterojunctions and low-dimensional structures, and is easy to achieve large-scale production on large-size substrates. MOCVD is an important method for preparing semiconductor photoelectronic and microelectronic devices, and promotes rapid development of semiconductor materials and device manufacturing technology. During an epitaxial growth process of MOCVD, carrier gases such as hydrogen and nitrogen carry reactants such as metal organic compounds and hydrides and transport the reactants to a reaction chamber, and the reactants undergo gas-phase reaction and surface reaction to form an epitaxial layer. A photo-assisted MOCVD apparatus can introduce a light field matching vibration mode of reactant molecules, such that cleavage efficiency of the reactant molecules can be improved through resonant absorption of energy of the light field by the reactant molecules, thus promoting the epitaxial process and improving epitaxial quality.

Improvement of utilization efficiency of energy of the light field and improvement of epitaxial uniformity are core issues in design of photo-assisted MOCVD apparatuses and are also keys to achieving industrialization of photo-assisted MOCVD technology. However. MOCVD apparatuses for large-scale production have complicated temperature-field and flow-field distributions, and presence of the light field further increases complexities of chamber structure of MOCVD, mass transport and chemical reactions in the reaction chamber. In order to improve utilization efficiency of energy of the light field and epitaxial uniformity, designs of coupling mechanism of the light field and chamber structure of the photo-assisted MOCVD apparatus are required to be optimized so as to achieve large-size and high-uniformity photo-assisted MOCVD epitaxy of semiconductor materials.

SUMMARY

In view of the above problems in the prior art, the present disclosure provides a vertical photo-assisted MOCVD apparatus and a deposition method using the same. In the deposition method, reactants are delivered to a growth zone along a horizontal direction in a reaction chamber, a light field acts on reactant gas flows along a direction perpendicular to a delivery direction of the reactants, and photo-assisted MOCVD epitaxy process is completed in the growth zone through photo-generated reactants.

One purpose of the present disclosure is to provide a vertical photo-assisted MOCVD apparatus.

The vertical photo-assisted MOCVD apparatus of the present disclosure includes: a light source, a beam transmission system, a top cover, a chamber, a substrate susceptor, motion components, a horizontal layered showerhead, first to Nth gas inlets, light field coupling windows, beam shaping devices, in-situ monitoring windows, a vacuum pump interface, and a heating device. The chamber has a bottom base and an open top; the substrate susceptors are positioned in the chamber, with their center mounted on a rotating shaft driven by a motor; multiple motion components are arranged on the substrate susceptor, and each of the multiple motion components is capable of rotating around a central axis thereof: the heating device is arranged below the substrate susceptor; the top cover is arranged at the top of the chamber to seal the chamber, and space between the chamber and the top cover is formed as an MOCVD reactor; the horizontal layered showerhead is arranged above the substrate susceptor at the center of the chamber, and the center of the horizontal layered showerhead is coaxial with the rotating shaft, and corresponding to the first to Nth gas outlets, the horizontal first to Nth gas outlets in N rows are formed in the horizontal layered showerhead, respectively; first to Nth gas inlets are formed on the top cover along a direction perpendicular to the surface of the substrate susceptor, respectively, and the first to Nth gas inlets connect to the MOCVD reactor through the first to Nth gas outlets, respectively; multiple light field coupling windows are arranged on the top cover with the horizontal layered showerhead as a center, and the multiple light field coupling windows are symmetrically distributed with respect to the center of the horizontal layered showerhead, and the centers of the multiple light field coupling windows are located at a same circle; the beam shaping devices are arranged in the light field coupling windows; the external light source is transmitted through the light beam transmission system and vertically enters the MOCVD reactor via the optical field coupling window; at least one in-situ monitoring window is arranged on the top cover and located outside the region of the multiple light field coupling windows, and a center of the in-situ monitoring window is located above the zone on the substrate susceptor where substrates are placed on the substrate tray; a light field coupling chamber is formed between a zone that is covered by a light field on the substrate susceptor and the top cover; a growth chamber is formed between the substrate susceptor zone where the substrates are placed on and the top cover above; a gas flow guide chamber is formed between the light field coupling chamber and the growth chamber: the distance between the substrate susceptor and the top cover in the light field coupling chamber is greater than the distance between the substrate susceptor and the top cover in the growth chamber, and the distance between the substrate susceptor and the top cover in the gas flow guide chamber gradually increases, and an inclination angle is formed: the distance between the substrate susceptor and the top cover gradually decreases from a side of the light field coupling chamber to a side of the growth chamber, such that gas flows in the gas flow guide chamber flow to the growth chamber at an increasing speed; the suction pump interface is formed at a bottom of the chamber: N is a natural number of greater than or equal to 2: A method for using the vertical photo-assisted MOCVD apparatus includes: placing at least one growth substrate on the motion components located on the substrate susceptor, and then placing the substrate susceptor on the rotating shaft in the MOCVD reactor: driving, by the motor, the rotating shaft to drive the substrate susceptor to rotate, and driving, by the motion components on the substrate susceptor the growth substrates to rotate around a central axis of the growth substrate; heating the substrate susceptor: allowing carrier gases carrying the reactants, and spacing gases enter the MOCVD reactor through the first to Nth gas inlets and the horizontal first to Nth gas outlets of the horizontal layered showerhead to form horizontal layered reactant gas flows and horizontal layered spacing gas flows that flow along a direction parallel to the surface of the substrate susceptor, where each of the horizontal layered spacing gas flows is between two horizontal layered reactant gas flows of different reactant elements to reduce gas-phase reactions between the reactants during the gas transport process: allowing the horizontal layered reactant gas flows and the horizontal layered spacing gas flows enter the light field coupling chamber through gas inlets on a side surface of the horizontal layered showerhead: allowing the light source to generate a light field matching the energy of vibration modes of one or more reactant molecules in the MOCVD reaction chamber, and allowing the light field enter the light field coupling windows through the beam transmission system, and is reshaped by the beam shaping devices, and then vertically enters the light field coupling chamber and illuminates on the substrate susceptor to form a light field distribution that acts on the horizontal layered reactant gas flows: exciting the horizontal layered reactant gas flows by the light field to produce active reactant gas flows, and exciting the reactants by the light field to produce photo-generated reactants in the light field coupling chamber: under protection of the spacing gas flows, allowing the photo-generated reactants flow into the growth chamber through accelerating action of the gas flow guide chamber and perform chemical vapor deposition on a surface of the growth substrates heated in the growth chamber to form epitaxial layers on the growth substrates, thereby achieving photo-assisted MOCVD epitaxial growth: during the photo-assisted MOCVD epitaxial growth process, monitoring a growth status on the growth substrates in the MOCVD reactor through the in-situ monitoring windows; and connecting the vacuum pump interface to an external vacuum pump to pump reactants that are not participated in chemical reactions, as well as byproducts of the chemical reactions out of the MOCVD reactor by the suction pump through the suction pump interface.

The light source is selected from a group consisting of lasers, superluminescent diodes, high-intensity discharge lamps, and light-emitting diodes.

A combination of a concave lens and a convex lens is provided as the beam shaping device, which is configured to perform an operation or a combination of two or more operations selected from a group consisting of beam focusing, beam divergence, beam collimation, and beam expansion. The beam transmission system includes one or more optical components, mechanical fixation devices, and displacement regulation devices configured to perform one or more operations selected from a group consisting of beam focusing, beam expansion, beam splitting, beam reflection, and beam collimation.

An inclination angle of the top cover corresponding to the gas flow guide chamber is in the range from 0° to 45°.

The reactants include hydride sources and metalorganic sources, and the hydride sources and the metalorganic sources carried by the carrier gases enter the MOCVD reactor through different gas inlets.

The precursors containing reactant elements are provided as the reactants, and a mixture of one or more gases selected from a group consisting of hydrogen, nitrogen, and inert gas is provided as the carrier gases, and a mixture of one or more gases selected from a group consisting of inert gas, hydrogen, and nitrogen is provided as the spacing gases.

A heating filament is provided as the heating device, and the heating filament is connected to an external power supply. Auxiliary devices include a power supply module, a gas flow delivery pipeline, a flow control device, a real-time monitoring device, a safety interlocking device, and a cooling water loop where the cooling water loop is arranged inside or on the wall of the top cover and the chamber, as well as in the optical components, the delivery pipelines, and the adjustment devices of the beam transmission system; and the cooling water is circulated to take away heat radiation generated by the heating device and heat caused by the light field.

Another purpose of the present disclosure is to provide a deposition method using the vertical photo-assisted MOCVD apparatus.

The deposition method using the vertical photo-assisted MOCVD apparatus in the present disclosure includes the following steps:

1) placing at least one growth substrate on the motion components located on the substrate susceptor, and then placing the substrate susceptor on the rotating shaft in the MOCVD reactor; driving, by motor, the rotating shaft to drive the substrate susceptor to rotate, and driving, by the motion components on the substrate susceptor, the growth substrates to rotate around a central axis of the growth substrate;
2) heating the substrate susceptor;
3) allowing carrier gases carrying reactants and spacing gases enter the MOCVD reactor through the first to Nth gas inlets and the horizontal first to Nth gas outlets of the horizontal layered showerhead to produce horizontal layered reactant gas flows and horizontal layered spacing gas flows that flow along a direction parallel to a surface of the substrate susceptor, where each of the horizontal layered spacing gas flows is between two horizontal layered reactant gas flows of different reactant elements to reduce gas-phase reactions between the reactants during the gas transport process;
4) allowing the horizontal layered reactant gas flows and the horizontal layered spacing gas flows enter the light field coupling chamber through gas inlets on the side surface of the horizontal layered showerhead: allowing the light source to generate a light field matching the energy of vibration modes of one or more reactant molecules in the MOCVD reaction chamber, and allowing the light field enter the light field coupling windows through the beam transmission system, and is reshaped by the beam shaping devices, and then vertically enters the light field coupling chamber and illuminates on the substrate susceptor to form a light field distribution that acts on the horizontal layered reactant gas flows;
5) exciting the horizontal layered reactant gas flows by the light field to produce active reactant gas flows, and exciting reactants by the light field to produce photo-generated reactants in the light field coupling chamber: under protection of the spacing gas flows, allowing the photo-generated reactants flow into the growth chamber through accelerating action of the gas flow guide chamber and perform chemical vapor deposition on the surface of the growth substrates heated in the growth chamber to form epitaxial layers on the growth substrates, thereby achieving photo-assisted MOCVD epitaxial growth;
6) during the photo-assisted MOCVD epitaxial growth process, monitoring a growth status on the growth substrates in the MOCVD reactor through the in-situ monitoring windows; and
7) connecting the vacuum pump interface to an external vacuum pump to pump reactants that are not participated in chemical reactions, as well as byproducts of the chemical reactions out of the MOCVD reactor by the suction pump through the suction pump interface.

The present disclosure has the following advantages:

1. In the vertical photo-assisted MOCVD apparatus, the light field vertically acts on the layered reactant gas flows, and the interaction path between the light field and the reactant gas flows is short, which reduces the required light source power, lowers the design complexity of the photo-assisted MOCVD apparatus, improves the safety of the photo-assisted MOCVD apparatus and the utilization efficiency of the light field power.
2. In the vertical photo-assisted MOCVD apparatus, through self-rotation and revolution of the growth substrates with the substrate susceptor, active reactants generated by the light field are uniformly distributed between the growth substrates and within each growth substrate in the growth chamber, thereby achieving high uniformity of large-size photo-assisted MOCVD epitaxial growth.
3. In the vertical photo-assisted MOCVD apparatus, generation process of the photo-generated reactants and chemical vapor deposition process of the photo-generated reactants are spatially separated, thus the coupling of the light field/flow field/temperature field in the photo-assisted MOCVD apparatus is simplified.

DETAILED DESCRIPTION OF THE EMBODIMENTS

The present disclosure will be further described below by means of specific embodiments with reference to the accompanying drawings.

Figure 1:
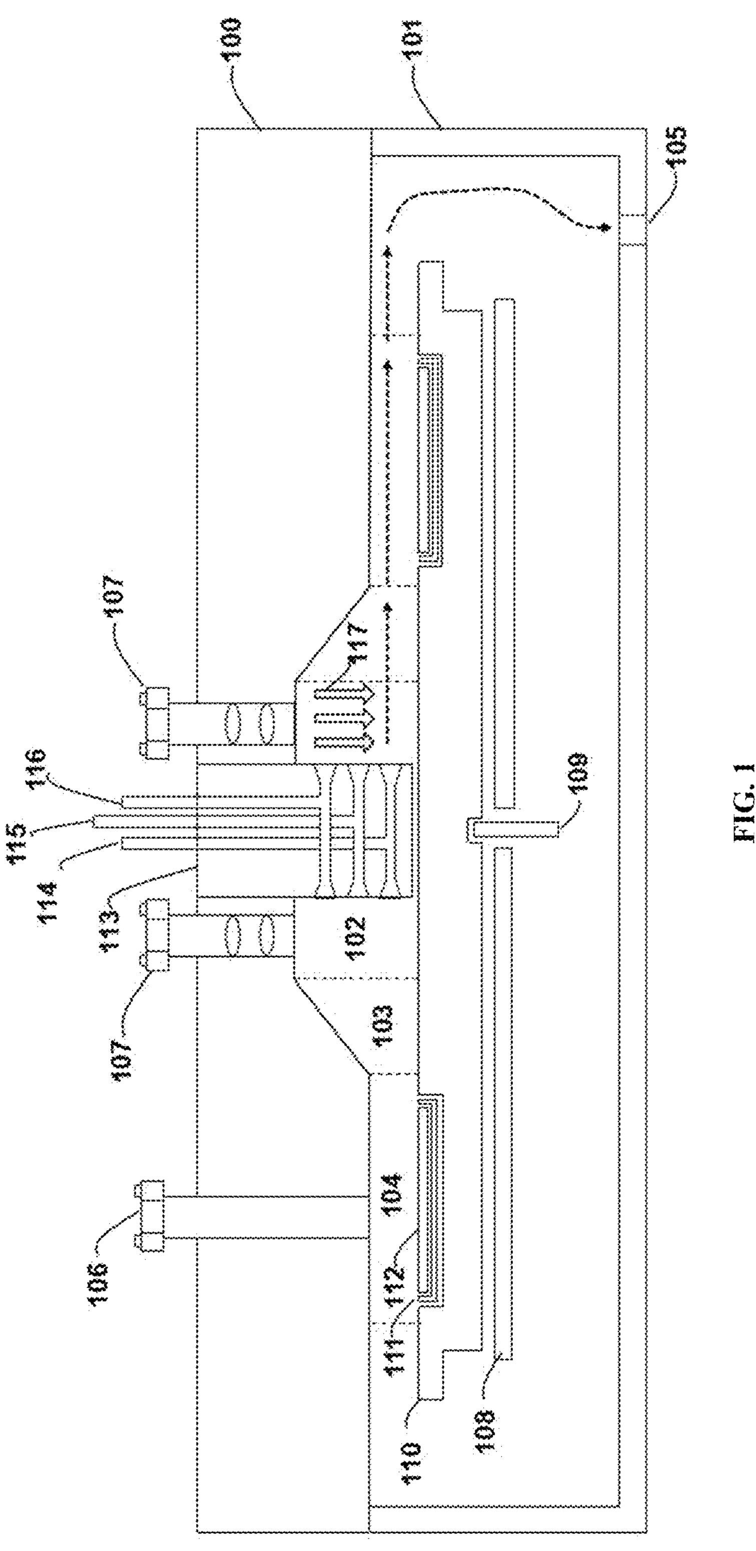
FIG. 1 is a cross-sectional view of an embodiment of the vertical photo-assisted MOCVD apparatus of the present disclosure.
Figure 2:
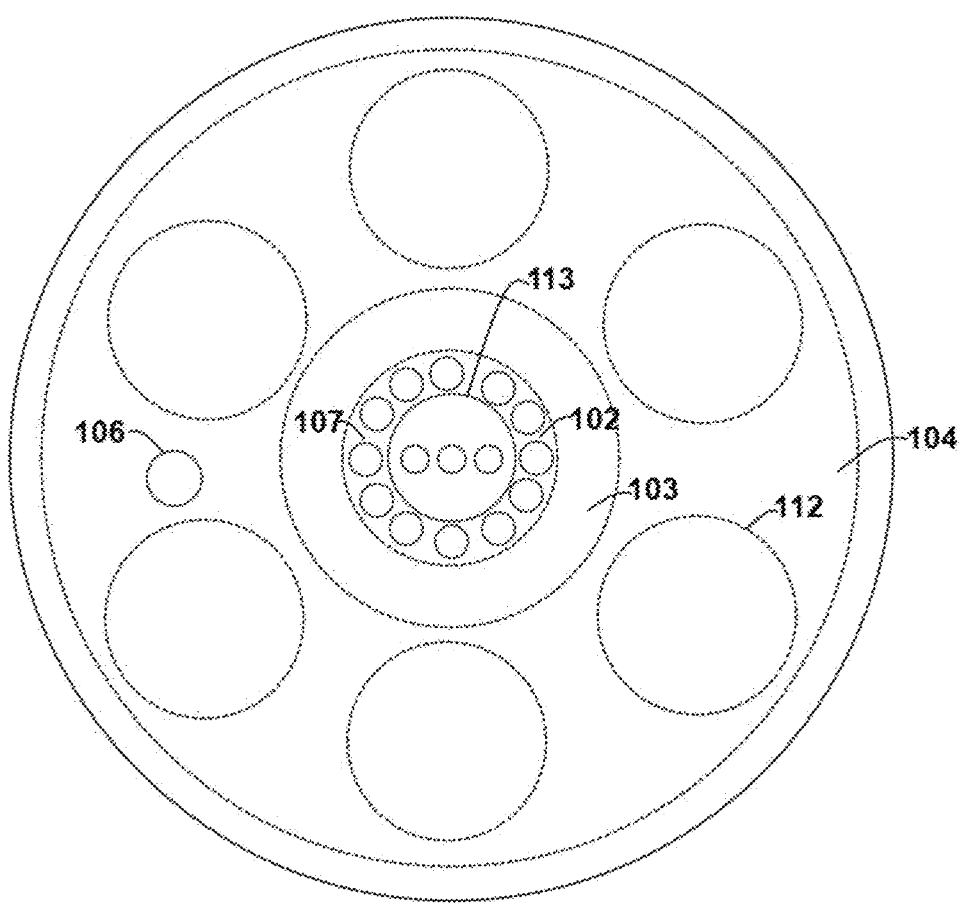
FIG. 2 is a top view of an embodiment of the vertical photo-assisted MOCVD apparatus of the present disclosure.

As shown in FIG. 1, a vertical photo-assisted MOCVD apparatus is provided in this embodiment, including: a light source, a beam transmission system, a top cover 100, a chamber 101, a substrate susceptor 110, motion components 111, a horizontal layered showerhead 113, first to third gas inlets 114, 115, and 116, light field coupling windows 107, beam shaping devices, an in-situ monitoring window 106, a vacuum pump interface 105, and a heating device 108, where the chamber has a bottom base and an open top: the vacuum pump interface is formed at the bottom base of the chamber: the substrate susceptors are arranged in the chamber, with their center mounted on a rotating shaft 109 driven by a motor, and the motor is located outside the MOCVD reactor: multiple motion components are arranged on the substrate susceptor, and each of the multiple motion components is capable of rotating around a central axis thereof: the heating device is arranged below the substrate susceptor: the top cover is arranged at the top of the chamber to seal the chamber, and space between the chamber and the top cover is formed as an MOCVD reactor: the horizontal layered showerhead is arranged above the substrate susceptor at the center of the chamber, and the center of the horizontal layered showerhead is coaxial with the rotating shaft, and horizontal first to third gas outlets in three rows are formed in the horizontal layered showerhead: first to third gas inlets are formed on the top cover along a direction perpendicular to the surface of the substrate susceptor, respectively, and the first to third gas inlets connect to the MOCVD reactor through the first to third gas outlets in the horizontal layered showerhead, respectively: multiple light field coupling windows are arranged on the top cover, and the multiple light field coupling windows are symmetrically distributed with respect to the center of the horizontal layered showerhead, and the centers of the multiple light field coupling windows are located at a same circle: the beam shaping devices are arranged in the light field coupling windows: the external light source is transmitted through the light beam transmission system and vertically enters the MOCVD reactor via the optical field coupling window: at least one in-situ monitoring window is arranged on the top cover and located outside the region of the multiple light field coupling windows, and located above the zone on the substrate susceptor where substrates are placed on: a light field coupling chamber 102 is formed between the region of multiple light field coupling windows on the top cover and the substrate susceptor zone underneath: the light field 117 vertically illuminates on the substrate susceptor zone in the light field coupling chamber: a growth chamber 104 is formed between the substrate susceptor zone where the growth substrates 112 are placed on and the top cover above: a gas flow guide chamber 103 is formed between the light field coupling chamber 102 and the growth chamber 104; the distance between the substrate susceptor and the top cover in the light field coupling chamber is greater than the distance between the substrate susceptor and the top cover in the growth chamber, and the distance between the substrate susceptor and the top cover in the gas flow guide chamber gradually decreases from the light field coupling chamber side to the growth chamber side, and an inclination angle is formed: the distance between the substrate susceptor and the top cover gradually decreases from a side of the light field coupling chamber to a side of the growth chamber, such that gas flows in the gas flow guide chamber flow to the growth chamber at an increasing speed.

In this embodiment, the light source is a laser, and the inclination angle of the top cover corresponding to the gas flow guide chamber is 30°.

Reactants include hydride sources and metalorganic sources, and the precursors containing reactant elements are provided as the reactants: carrier gases are inert gases: spacing gases are inert gases; and the heating device is a heating filament.

A deposition method using the vertical photo-assisted MOCVD apparatus in this embodiment is provided, including the following steps:

1) at least one growth substrate 112 is placed on motion components located on the substrate susceptor, and the substrate susceptor is placed on the rotating shaft in the MOCVD reactor: the rotating shaft is driven by the motor to drive the substrate susceptor to rotate, and the growth substrate is driven by the motion components on the substrate susceptor to rotate around a central axis of the growth substrate;

2) the substrate susceptor is heated (300° C. to 1.500° C.);

3) the hydride sources and the metalorganic sources carried by carrier gases pass through the first and third gas inlets respectively and spacing gases pass through the second gas inlet, and the hydride sources, the spacing gas, and the metal organic sources enter the MOCVD reactor through the horizontal layered first to third gas outlets of the horizontal layered showerhead to produce horizontal layered reactant gas flows and horizontal layered spacing gas flow that flow along a direction parallel to a surface of the substrate susceptor, where the horizontal layered spacing gas flow are between the horizontal layered reactant gas flows of different reactant elements to reduce gas-phase reactions between the reactants during the gas transport process;

4) the horizontal layered reactant gas flows and the horizontal layered spacing gas flow enter the light field coupling chamber through gas outlets nozzles on the side surface of the horizontal layered showerhead: the light source matching the energy of vibration modes of one or more reactant molecules passes through the beam transmission system and the light field coupling windows, and is reshaped by the beam shaping devices, and then vertically enters the light field coupling chamber and illuminates on the substrate susceptor to form a light field distribution 117 that acts on the horizontal layered reactant gas flows;

5) the horizontal layered reactant gas flows are excited by the light field to produce active reactant gas flows, and reactants are excited into photo-generated reactants in the light field coupling chamber: under protection of the spacing gas flows, the photo-generated reactants flow into the growth chamber through an accelerating action of the gas flow guide chamber and perform chemical vapor deposition on the surface of the growth substrates heated in the growth chamber to form an epitaxial layers on the growth substrates, thereby achieving photo-assisted MOCVD epitaxial growth; 6) during the photo-assisted MOCVD epitaxial growth process, a growth status on the growth substrates in the MOCVD reactor is monitored through the in-situ monitoring windows;

7) the vacuum pump interface connects to an external vacuum pump to pump reactants that are not participated in chemical reactions, as well as byproducts of the chemical reactions out of the MOCVD reactor.

Finally, it should be noted that the embodiment is intended to help further understand the present disclosure. However, those skilled in the art can understand that various substitutions and modifications may be made without departing from the spirit and scope of the present disclosure and the appended claims. Therefore, the present disclosure should not be limited to the content disclosed in the embodiment, and the protection scope claimed by the present disclosure is subject to the scope defined by the claims.

What is claimed is:

1. A vertical photo-assisted metal organic chemical vapor deposition (MOCVD) apparatus, comprising: a light source, a beam transmission system, a top cover, a chamber, a substrate susceptor, motion components, a horizontal layered showerhead, first to Nth gas inlets, light field coupling windows, beam shaping devices, in-situ monitoring windows, a vacuum pump interface, and a heating device; the chamber has a bottom base and an open top; the substrate susceptors are positioned in the chamber, with their center mounted on a rotating shaft driven by a motor; multiple motion components are arranged on the substrate susceptor, and each of the multiple motion components is capable of rotating around a central axis thereof; the heating device is arranged below the substrate susceptor; the top cover is arranged at a top of the chamber to seal the chamber, and space between the chamber and the top cover is formed as a reactor of the MOCVD apparatus; the horizontal layered showerhead is arranged above the substrate susceptor at a center of the chamber, and a center of the horizontal layered showerhead is coaxial with the rotating shaft, and corresponding to the first to Nth gas outlets, the first to Nth gas outlets in N rows are formed in the horizontal layered showerhead, respectively; first to Nth gas inlets are formed on the top cover along a direction perpendicular to the surface of the substrate susceptor, respectively, and the first to Nth gas inlets connect to the reactor of the MOCVD apparatus through the first to Nth gas outlets, respectively; multiple light field coupling windows are arranged on the top cover with the horizontal layered showerhead as a center, and the multiple light field coupling windows are symmetrically distributed with respect to the center of the horizontal layered showerhead, and centers of the multiple light field coupling windows are located at a same circle; the beam shaping devices are arranged in the multiple light field coupling windows; the light source is transmitted through the beam transmission system and vertically enters the reactor of the MOCVD apparatus via the optical field coupling windows; the in-situ monitoring windows are arranged on the top cover and located outside the region of the multiple light field coupling windows, and a center of the in-situ monitoring window is located above a zone on the substrate susceptor where substrates are placed on a substrate tray; a light field coupling chamber is formed between a zone that is covered by a light field on the substrate susceptor and the top cover; a growth chamber is formed between the zone on the substrate susceptor where the substrates are placed on and the top cover above; a gas flow guide chamber is formed between the light field coupling chamber and the growth chamber; the distance between the substrate susceptor and the top cover in the light field coupling chamber is greater than the distance between the substrate susceptor and the top cover in the growth chamber, and the distance between the substrate susceptor and the top cover in the gas flow guide chamber gradually increases, and an inclination angle is formed; the distance between the substrate susceptor and the top cover gradually decreases from a side of the light field coupling chamber to a side of the growth chamber, such that gas flows in the gas flow guide chamber flow to the growth chamber at an increasing speed; the suction pump interface is formed at a bottom of the chamber; N is a natural number of greater than or equal to 2.

2. The vertical photo-assisted MOCVD apparatus according to claim 1, wherein the light source is selected from a group consisting of lasers, superluminescent diodes, high-intensity discharge lamps, and light-emitting diodes.

3. The vertical photo-assisted MOCVD apparatus according to claim 1, wherein a heating filament is provided as the heating device, and the heating filament is connected to an external power supply.

4. A deposition method using the vertical photo-assisted MOCVD apparatus according to claim 1, comprising the following steps:

1) Placing at least one growth substrate on the motion components located on the substrate susceptor, and then placing the substrate susceptor on the rotating shaft in the reactor of the MOCVD apparatus; driving, by the motor, the rotating shaft to drive the substrate susceptor to rotate, and driving, by the motion components on the substrate susceptor, the growth substrates to rotate around a central axis of the growth substrate;
2) Heating the substrate susceptor;
3) allowing carrier gases carrying reactants and spacing gases to enter the reactor of the MOCVD apparatus through the first to Nth gas inlets and the horizontal first to Nth gas outlets of the horizontal layered showerhead to produce horizontal layered reactant gas flows and horizontal layered spacing gas flows that flow along a direction parallel to a surface of the substrate susceptor, where each of the horizontal layered spacing gas flows is between two horizontal layered reactant gas flows of different reactant elements to reduce gas-phase reactions between the reactants during the gas transport process;
4) Allowing the horizontal layered reactant gas flows and the horizontal layered spacing gas flows to enter the light field coupling chamber through side gas inlets on a side surface of the horizontal layered showerhead, wherein the side gas inlets are different from the first to Nth gas inlets; allowing the light source to generate a light field matching the energy of vibration modes of one or more reactant molecules in the reactor of the MOCVD apparatus, and allowing the light field enter the light field coupling windows through the beam transmission system, and is reshaped by the beam shaping devices, and then vertically enters the light field coupling chamber and illuminates on the substrate susceptor to form a light field distribution that acts on the horizontal layered reactant gas flows;
5) exciting the horizontal layered reactant gas flows by the light field to produce active reactant gas flows, and exciting reactants by the light field to produce photo-generated reactants in the light field coupling chamber; under protection of the spacing gas flows, allowing the photo-generated reactants flow into the growth chamber through accelerating action of the gas flow guide chamber and perform chemical vapor deposition on the surface of the growth substrates heated in the growth chamber to form epitaxial layers on the growth substrates, thereby achieving photo-assisted MOCVD epitaxial growth;
6) During the photo-assisted MOCVD epitaxial growth process, monitoring a growth status on the growth substrates in the reactor of the MOCVD apparatus through the in-situ monitoring windows; and
7) Connecting the vacuum pump interface to an external vacuum pump to pump reactants that are not participated in chemical reactions, as well as byproducts of the chemical reactions out of the reactor of the MOCVD apparatus by the suction pump through the suction pump interface.

5. The deposition method according to claim 4, wherein the reactants comprise hydride sources and metalorganic sources.

6. The deposition method according to claim 4, wherein precursors containing reactant elements are provided as the reactants, and a mixture of one or more gases selected from a group consisting of hydrogen, nitrogen, and inert gas is provided as the carrier gases, and a mixture of one or more gases selected from a group consisting of inert gas, hydrogen, and nitrogen is provided as the spacing gases.

* * * * *